US005212390A

United States Patent [19]
LeBeau et al.

[11] Patent Number: 5,212,390
[45] Date of Patent: May 18, 1993

[54] LEAD INSPECTION METHOD USING A PLANE OF LIGHT FOR PRODUCING REFLECTED LEAD IMAGES

[75] Inventors: Christopher J. LeBeau; Shay-Ping T. Wang, both of Tempe, Ariz.

[73] Assignee: Motorola, Inc., Schaumburg, Ill.

[21] Appl. No.: 878,371

[22] Filed: May 4, 1992

[51] Int. Cl.$^5$ .............................................. G01V 9/04
[52] U.S. Cl. .................................... 250/561; 356/376; 29/705
[58] Field of Search ........................ 250/561, 563, 560; 356/376, 394, 237, 375; 358/106, 107; 29/705, 709, 710, 566.3

[56] References Cited

U.S. PATENT DOCUMENTS

| | | | |
|---|---|---|---|
| 4,696,047 | 9/1987 | Christian et al. | 356/394 |
| 4,741,621 | 5/1988 | Taft et al. | 356/394 |
| 4,874,956 | 10/1989 | Kato et al. | 250/561 |
| 5,012,524 | 4/1991 | LeBeau | 382/8 |
| 5,102,224 | 4/1992 | Uesugi et al. | 356/376 |

FOREIGN PATENT DOCUMENTS 01272126 10/1989 Japan .

OTHER PUBLICATIONS

Petros Maragos; "Tutorial on Advances in Morphological Image Processing and Analysis,"; Optical Engineering, vol. 26, No. 7, pp. 623–632; Jul. 1987.

*Primary Examiner*—David C. Nelms
*Assistant Examiner*—Que T. Le
*Attorney, Agent, or Firm*—Joe E. Barbee

[57] ABSTRACT

Light (19) is projected at an incidence angle (29) onto a plurality of leads (12, 13). The light (19) is simultaneously reflected from each of the plurality of leads (12, 13). The light that is simultaneously reflected (24, 26) from each lead (12, 13) is detected. A cotangent function of the incidence angle (29) is utilized to detect an amount of displacement (32) of at least one of the plurality of leads.

13 Claims, 1 Drawing Sheet

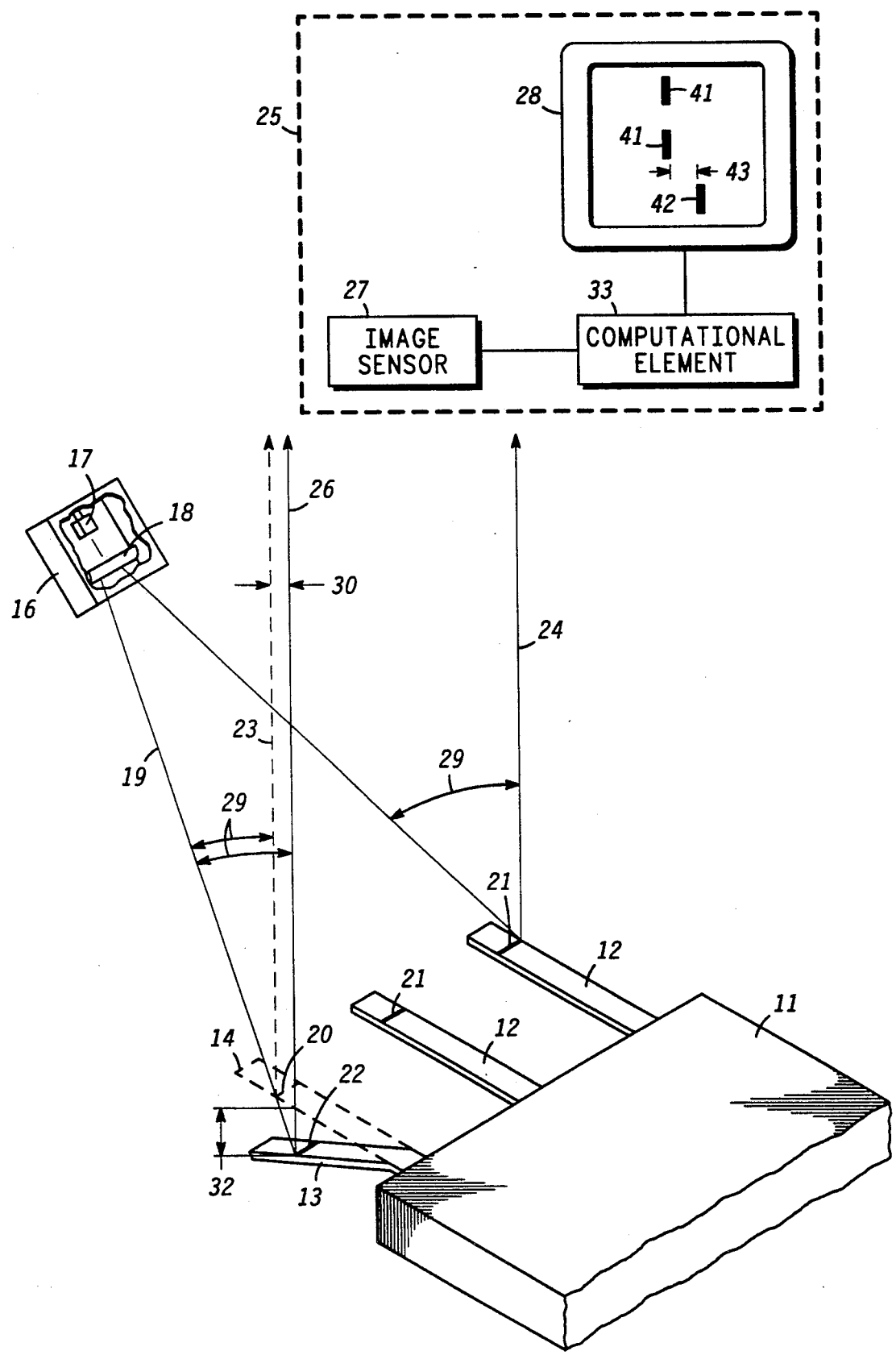

LEAD INSPECTION METHOD USING A PLANE OF LIGHT FOR PRODUCING REFLECTED LEAD IMAGES

BACKGROUND OF THE INVENTION

The present invention relates, in general, to inspection techniques, and more particularly, to a novel method of inspecting the leads of a semiconductor package.

In the past, a variety of methods have been employed to inspect semiconductor packages for the presence of bent leads. These prior methods generally involve shining a laser beam on a lead of a semiconductor package, detecting light reflected from the lead, and moving the package to permit the laser beam to sequentially shine on each lead of the package. The time interval between reflected beams is used to detect the presence of a bent lead. Such an inspection method generally requires a considerable amount of time to inspect each lead of a high pin count semiconductor package. The lengthy inspection time results in a high inspection cost.

Accordingly, is is desirable to have an inspection method that rapidly detects the presence of a bent lead, and that has a low inspection cost.

SUMMARY OF THE INVENTION

Briefly stated, the present invention includes projecting light onto a plurality of leads. The light impinges upon the leads at an incidence angle, and is simultaneously reflected from each of the plurality of leads. The light that is simultaneously reflected from each lead is detected. A cotangent function of the incidence angle is utilized to detect a distance of displacement for at least one of the plurality of leads.

BRIEF DESCRIPTION OF THE DRAWINGS

The sole FIGURE illustrates an embodiment of a lead inspection method in accordance with the present invention.

DETAILED DESCRIPTION OF THE DRAWINGS

The sole FIGURE illustrates some of the principle features of a lead inspection method. An enlarged portion of a semiconductor package 11 includes a plurality of leads 12 and 13 extending from package 11. Package 11 along with leads 12 and 13 are enlarged in relation to other elements for clarity of the explanation. Typically, it is desirable to have leads 12 and 13 in substantially coplanar alignment. During package manufacturing operations, leads often are bent and displaced from the desired coplanar position. Therefore, it is necessary to identify packages having leads with excessive displacement to facilitate rejecting these packages. Lead 13 is illustrated as such a bent lead that has been displaced from a desired coplanar position illustrated by dashed line 14.

Leads 12 and 13 are inspected by illuminating a portion of leads 12 and 13 with a thin plane of light 19. Light 19 impinges leads 12 and 13 at an incidence angle 29 thereby forming a thin light line 21 on leads 12 and a thin light line 22 on lead 13. Plane of light 19 is produced by a light source 16 which can have a variety of configurations that focus light into a thin plane. In the preferred embodiment, light 19 is produced by focussing the output of a laser diode 17 through a semi-cylindrical lens 18. In this preferred embodiment, plane 19 has a thickness between approximately twenty-five and fifty microns. Other configurations include, but are not limited to, an incandescent lamp or an arc-lamp that is focused into a place of light or a laser that is focused into a plane of light by a rotating mirror.

An imaging system 25 detects light images, in the form of light reflected from lines 21 and 22, and compares the position of the images to a predetermined image position. The predetermined image position typically corresponds to an expected position of images that would be produced by a plurality of coplanar leads. Variations from the predetermined position are used to determine the severity of the bend and to determine if the package is usable or is to be rejected. Alternately, the relative position between the detected images can be utilized to determine a relative variation between each lead. Imaging system 25 includes an image sensor 27 which detects light reflected from leads 12 and 13. Image sensor 27 also provides an output that indicates the position of light received from each of leads 12 and 13. Image sensor 27 can be a variety of image sensing devices including, but not limited to, a plurality of optical detectors arranged into an array or a solid state camera. Imaging system 25 also includes a computational element 33 which is connected to image sensor 27. Element 33 accepts the output of image sensor 27, and determines the amount each detected image varies from the predetermined image position. In the preferred embodiment, imaging system 25 is a vision system which employs a camera for image sensor 27, a digital computer for computational element 33, and also includes a display 28 that displays the reflected image of lines 21 and 22. Such vision systems are well known to those skilled in the art. Examples of some types of vision systems and image processing methods used by vision systems are provided in U.S. Pat. No. 5,012,524 issued to LeBeau et al on Apr. 30, 1991 and also in an article by P. Maragos, "Tutorial On Advances In Morphological Image Processing And Analysis", *Optical Engineering*, Vol 26, No. 7, pp. 623–632, July 1987 which are hereby incorporated herein by reference.

Light source 16 and imaging system 25 are geometrically arranged so that angle 29 and the position of image sensor 27 produce a geometric shape which facilitates calculation of the distance lead 13 is displaced from the desired coplanar position of dashed line 14. Line 21 produces a light reflection 24 which is indicated by an arrow. Similarly, a dashed line 23 indicates a reflection that would be produced by a light line 20 if lead 13 was coplanar to leads 12. Since lead 13 is bent, line 22 produces a reflection 26, indicated by an arrow, which is laterally displaced from dashed line 23 by an offset 30. It can be seen that offset 30 represents one side of a right triangle. The hypotenuse is formed by light 19 as it impinges upon lead 13 at line 22. The triangle's second side is formed by a displacement 32 which represents the distance, at the position of line 22, that lead 13 is displaced from the coplanar position indicated by dashed line 14. Once the value of offset 30 is determined by system 25, the distance of displacement 32 can be geometrically calculated.

Reflected images of lines 21 and 22 are detected by imaging system 25 as reflections 24 and 26. System 25 determines the value of offset 30 by comparing the position of the reflected images to the predetermined position. In the preferred embodiment, the vision system detects reflections 24 and 26, and displays an image 42 and a plurality of images 41 that correspond to line 22 and lines 21 respectively. Also in the preferred embodiment, imaging system 25 determines a value for a variation 43 which corresponds to offset 30. Vision system methods for determining the location of light patterns and the distance between such light patterns is well known to those skilled in the art. Since angle 29 is known and the value of offset 30 is determined by imaging system 25, the distance of displacement 32 can be calculated. The correlation between variation 43 and offset 30 is a function of angle 29, and the angle between image sensor 27 and lines 21 and 22. Positioning image sensor 27 directly above lines 21 and 22 forms a right angle that facilitates easy calculation of displacement 32. Other angles could be used but complicate the calculations. Also, a variety of angles can be used for angle 29. At an angle 29 of forty-five degrees, offset 30 equals displacement 32. At values of angle 29 that are less than forty-five degrees, offset 30 is less than displacement 32, while at values greater than forty-five degrees offset 30 is greater than displacement 32. Therefore, angle 29 can be varied to increase or decrease the sensitivity of imaging system 25. In the preferred embodiment, angle 29 is forty-five degrees and image sensor 27 is directly above lines 22 and 21, thus, displacement 32 can be calculated as a cotangent function as shown below:

displacement 32 = (variation 43) × cotangent (angle 29).

Some types of semiconductor packages employ a plurality of leads extending from all sides of the package. Such packages can be inspected by illuminating each set of leads with a separate light source 16, and centering image sensor 27 above the package. It should also be noted that the inspection method is also applicable to tape automated bonded (TAB) semiconductor devices that do not have a package body, and to lead frames.

By now it should be appreciated that there has been provided a novel method of inspecting the leads of a semiconductor package. A plane of light is used to simultaneously illuminate a plurality of leads. The plane of light impinges the leads at an incidence angle thereby permitting the amount of displacement to be calculated from the reflected image of each lead. The method simultaneously inspects all leads of the package thereby minimizing the time required for the inspection. Therefore, the method also reduces inspection cost compared to prior inspection methods.

We claim:

1. A lead inspection method comprising:
providing a semiconductor package having a plurality of leads along at least one side of the package;
illuminating a portion of each lead with a plane of light wherein an incidence angle is formed between the plane of light and each lead, the plane of light producing a reflected lead image for the portion of each lead;
simultaneously detecting each reflected lead image;
determining a position for each reflected lead image;
determining an amount of variation between a position of each reflected lead image and a predetermined image position by using a vision system having a solid state camera; and
using the amount of variation and the incidence angle for determining a distance each lead is displaced from a predetermined coplanar position.

2. The method of claim 1 wherein illuminating the portion of each lead with the plane of light includes creating the plane of light by projecting a laser beam through a semi-cylindrical lens.

3. The method of claim 1 wherein using the amount of variation and the incidence angle for determining the distance each lead is displaced includes multiplying the amount of variation times a cotangent of the incidence angle.

4. The method of claim 1 wherein illuminating the portion of each lead with the plane of light wherein the incidence angle is formed includes illuminating the portion of each lead with the plane of light having approximately a 45 degree incidence angle.

5. The method of claim 1 wherein illuminating the portion of each lead with the plane of light includes illuminating the portion of each lead with the plane of light having a thickness between approximately twenty-five and fifty microns.

6. A method of inspecting leads of a semiconductor package comprising;
providing a semiconductor package having a plurality of leads;
projecting a plane of light onto the plurality of leads thereby producing a reflected lead image of each lead of the plurality of leads wherein an incidence angle is formed between the plane of light and the plurality of leads;
simultaneously detecting a position of the reflected lead image of each lead;
determining an amount of variation between each lead reflected image and a predetermined reflected position; and
determining a distance each lead is displaced by using the amount of variation and the incidence angle.

7. The method of claim 6 wherein projecting the plane of light onto the plurality of leads includes producing the plane of light by shining the output of a laser diode through a semi-cylindrical lens.

8. The method of claim 6, wherein determining the amount of variation between each reflected lead image includes using a vision system to determine a relative variation between each lead of the plurality of leads.

9. The method of claim 6 wherein determining the distance each lead is displaced by using the amount of variation and the incidence angle includes multiplying the variation times a cotangent function of the incident angle.

10. A lead inspection method comprising:
projecting light onto a plurality of leads wherein the light forms an incidence angle;
detecting reflected light that is simultaneously reflected from the plurality of leads;
calculating a distance of displacement for at least one lead of the plurality of leads by using a cotangent of the incidence angle.

11. The method of claim 10 wherein projecting light onto the plurality of leads includes projecting a plane of light onto the plurality of leads.

12. The method of claim 11 wherein projecting the plane of light onto the plurality of leads includes projecting the plane of light having a thickness of between approximately twenty-five and fifty microns.

13. The method of claim 10 wherein detecting reflected light that is simultaneously reflected from the plurality of leads includes using a vision system for detecting a position of the reflected light from each lead and determining a variation between the position and a predetermined reflected position.

* * * * *